United States Patent [19]

Bahlmann

[11] Patent Number: 4,956,565

[45] Date of Patent: Sep. 11, 1990

[54] OUTPUT CIRCUIT WITH DRIVE CURRENT LIMITATION

[75] Inventor: Johannes P. M. Bahlmann, Eindhoven, Netherlands

[73] Assignee: U.S. Philips Corp., New York, N.Y.

[21] Appl. No.: 337,021

[22] Filed: Apr. 12, 1989

[30] Foreign Application Priority Data

Apr. 28, 1988 [NL] Netherlands ............................ 8801103

[51] Int. Cl.⁵ .................................................. H03K 17/00
[52] U.S. Cl. ................................... 307/254; 307/270; 307/300; 307/315; 361/93
[58] Field of Search ............... 307/270, 315, 454, 455, 307/300, 359

[56] References Cited

U.S. PATENT DOCUMENTS

| | | | |
|---|---|---|---|
| 3,553,601 | 1/1971 | Glasser | 307/270 |
| 3,825,774 | 7/1974 | van Kessel et al. | 307/270 |
| 3,889,137 | 6/1975 | Kay | 307/300 |
| 3,928,773 | 12/1975 | Oguey et al. | 307/451 |
| 4,028,561 | 6/1977 | Black et al. | 307/254 |
| 4,164,747 | 8/1979 | Gerstner | 307/315 |
| 4,289,977 | 9/1981 | Powers et al. | 307/270 |
| 4,437,021 | 3/1984 | Sumi et al. | 307/270 |
| 4,533,839 | 8/1985 | Balakrishnan | 307/270 |
| 4,535,258 | 8/1985 | Tanizawa | 307/270 |
| 4,553,044 | 11/1985 | Bittner | 307/270 |
| 4,649,294 | 3/1987 | McLaughlin | 307/451 |
| 4,855,625 | 8/1989 | Webb | 307/454 |
| 4,885,486 | 12/1989 | Shékhawat | 307/315 |

Primary Examiner—Stanley D. Miller
Assistant Examiner—T. Cunningham
Attorney, Agent, or Firm—Steven R. Biren

[57] ABSTRACT

A transistor output stage including an output transistor having its base coupled to the emitter of a driver transistor is driven into saturation by a current source which is connected to the base of the driver transistor. When a small output current is flowing through the load connected to the collector of the output transistor, the surplus of the current from the current source is drained from the base of the driver transistor to the collector of the output transistor via the collector-emitter path of a limiting transistor having its base connected to the base of the output transistor. This reduces the power dissipation in the driver transistor and improves the power efficiency of the transistor output stage.

1 Claim, 1 Drawing Sheet

OUTPUT CIRCUIT WITH DRIVE CURRENT LIMITATION

BACKGROUND OF THE INVENTION

The invention relates to a transistor circuit arrangement having:

an output transistor having an emitter, a base and a collector, a driver transistor having an emitter, a base and a collector and having its emitter coupled to the base of the output transistor, and a limiting transistor having an emitter, a base and a collector and having its emitter coupled to the collector of the output transistor, and having its collector coupled to the base of the driver transistor for limiting a drive current applied to the base of the driver transistor.

Such an arrangement is known from U.S. Pat. No. 4,583,051, FIG. 4 and is inter alia suitable for use in power output stages of motor drives.

In output stages for driving motors the output transistors are driven into saturation, so that substantially the entire power-supply voltage is available across the motor. The current to be supplied to the motor may vary substantially depending on the mechanical load of the motor. In order to ensure that the output transistor remains saturated for the rated maximum load current and for the minimum current gain of the output stage, this stage is driven with a certain surplus of input current. This surplus is proportionally largest if the current to be supplied to the load by the output stage is small. FIGS. 3 and 4 of the aforementioned U.S. Patent show commonly used prior art output stages which comprise a driver transistor and an output transistor. The input current of the output stage is applied to the base of the driver transistor of the output stage. In a first known output stage the emitter of the driver transistor is connected to the base of the output transistor and the collector of the driver transistor is connected to a fixed supply voltage. In a second known output stage, the Darlington output stage, the collector of the driver transistor is connected to the collector of the output transistor. In each of the two known output stages the load is connected between the collector of the output transistor and a supply voltage. The emitter of the output transistor is connected to a supply voltage which is lower in the case of NPN transistors. If the load current of the output stage is always small the second output stage of the Darlington type is to be preferred on account of the low heat dissipation in the driver transistor. Indeed, the collector of the driver transistor is connected to the low output voltage of the output stage. Even the surplus of input current, which flows through the driver transistor after being amplified, does not give rise to any dissipation problems. Generally, the collector of the driver transistor in the first output stage will be connected to a much higher voltage and will dissipate more heat under otherwise similar conditions. It is the comparatively large overdrive of the output stage for small output current which causes a significant dissipation in the driver transistor of the first output stage. If the load current of the output stage is always large the first output stage is to be preferred on account of the substantially smaller voltage drop across the output transistor. The dissipation in the output stage is now dictated almost entirely by the heat developed in the output transistor. Under these conditions the dissipation in the driver transistor is of subordinate importance.

Without further steps the known output stages, which are driven into saturation, do not allow the head dissipation in the output stage to be minimized both for large and small load currents.

In the known transistor arrangement the heat dissipation in the driver transistor of the output stage, which is of the first type, can be reduced for small load currents by preventing the output transistor from being driven unnecessarily far into saturation. In that case the driver transistor need not supply an unnecessarily large amount of current to the base of the output transistor, which reduces the dissipation in the driver transistor. This is achieved by draining a part of the total input current of the output stage from the base of the driver transistor by means of a series arrangement of a diode-connected limiting transistor and a Schottky diode between the base of the driver transistor and the collector of the output transistor. As soon as the collector-emitter voltage decreases below a specific value, the series arrangement will drain the surplus input current.

When the known transistor arrangement is integrated additional process steps are necessary to fabricate the Schottky diode, which renders the integrated transistor arrangement more intricate.

SUMMARY OF THE INVENTION

It is the object of the invention to simplify the known transistor arrangement.

According to the invention a transistor arrangement of the type described above is characterized in that, the limiting transistor has its base coupled to the base of the output transistor. When the limiting transistor is arranged in this way, the Schottky diode becomes redundant. Another advantage of the absence of the Schottky diode is that the transistor arrangement can be fabricated in a smaller number of process steps. The base-emitter junction of the limiting transistor becomes conductive when the collector-emitter voltage of the output transistor decreases as a result of overdriving. The input-current surplus is then drained via the collector-emitter path of the limiting transistor.

BRIEF DESCRIPTION OF THE DRAWING

The invention will now be described in more detail, by way of example, with reference to the accompanying drawing, in which.

DESCRIPTION OF THE PREFERRED EMBODIMENT

Figure 1:
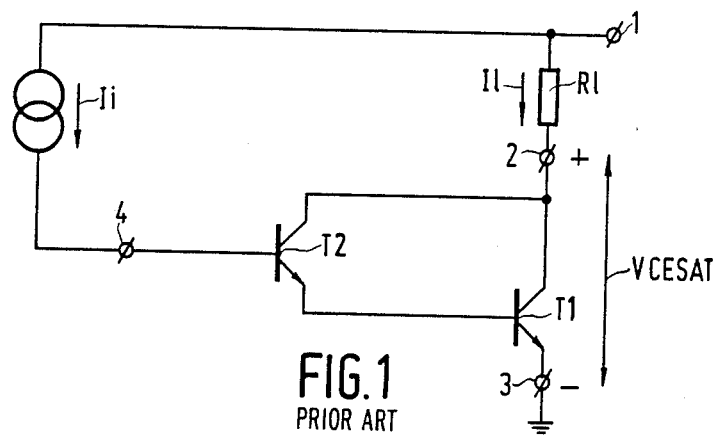
FIG. 1 shows a first known transistor arrangement for an output stage.

FIG. 1 shows a known output stage, comprising a Darlington transistor pair T1 and T2. T1 is the output transistor and T2 is the driver transistor. The output stage can supply a current Il from a positive power-supply terminal 1 through a load Rl via a terminal 2. In practice, Rl is an electric motor which produces a large or a small current Il depending on its mechanical load. The emitter of the output transistor T1 is coupled to a negative power-supply terminal 3, which in the present example is connected to ground. A current source Ii between the positive power-supply terminal and an input terminal 4 which is coupled to the base of the driver transistor T2 drives the output stage into saturation. However, any other drive yielding the same result is possible. The current source Ii is dimensioned so as to bottom the output transistor T1 for the minimum current gain of the transistors T1 and T2 and for the maximum load current Il. In practice, the current source Ii is turned on and off in order to start or stop the motor, or to reverse its direction of rotation. The saturation voltage across T1 (VCESAT) is approximately 1 V. This comparatively high value is typical of a Darlington transistor pair. If a large current is to be supplied to the load Rl substantially all the drive current Ii is employed to keep the output transistor T1 saturated. The amount of heat developed in the output transistor is comparatively large on account of the high saturation voltage VCESAT. The dissipation in the driver transistor T2 is comparatively low and may be ignored. If a small current is to be supplied to the load Rl the dissipation in the output transistor T1 is low. The input current Ii, which is now disproportionately large, is amplified by the driver transistor T2 and fed to the base of the output transistor T1. Since the collector of the driver transistor T2 is connected to the low collector voltage of the output transistor T1, the dissipation in the driver transistor remains low. In this way the Darlington output stage provides a high efficiency for small load currents and a low efficiency for large load currents.

Figure 2:
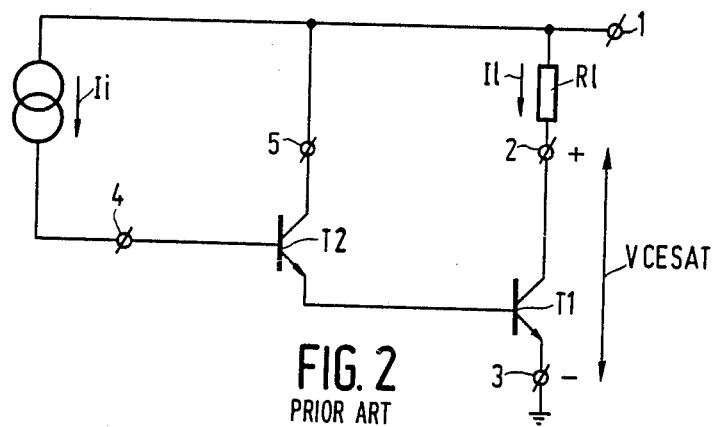
FIG. 2 shows a second known transistor arrangement for an output stage.

FIG. 2 shows another known output stage, comprising an output transistor T1 and a driver transistor T2. Here the collector of the driver transistor T2 is connected to the power-supply terminal 5 which in the present example is connected to the positive power-supply terminal 1. All the other reference numerals in FIG. 2 have the same meaning as those in FIG. 1. This output stage has a substantially lower saturation voltage VCESAT than the Darlington arrangement of FIG. 1, namely about 0.3 V. For a large load currents Il the dissipation in the output transistor T1 is therefore substantially lower than that in the Darlington output stage. Since the collector of the driver transistor T2 is connected to a higher voltage, the dissipation in the driver transistor T2 is higher than in the driver transistor of the Darlington output stage but it is small in comparison with the dissipation in the output transistor. For a small load current Il the dissipation in the output transistor T1 is low, but the now disproportionately large input current Ii gives rise to a substantial dissipation in the driver transistor. The efficiency of the output stage of FIG. 2 is high for large load currents and low for small load currents. By means of the known circuit arrangements it is not possible to minimize the dissipation of the output stage under greatly varying load conditions.

Figure 3:
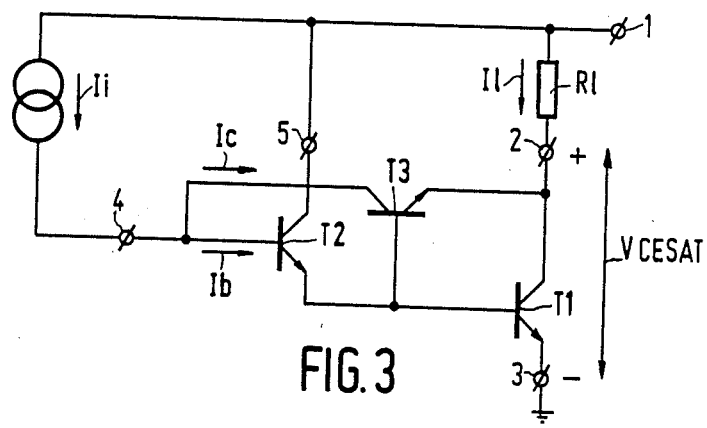
FIG. 3 shows an embodiment of a transistor arrangement for an output stage in accordance with the invention.

FIG. 3 shows an embodiment of a transistor arrangement in accordance with the invention. The arrangement differs from that shown in FIG. 2 by the addition of a limiting transistor T3 whose base is connected to the base of the output transistor T1, whose emitter is connected to the collector of the output transistor T1, and whose collector is coupled to the base of the driver transistor T2. All the other reference numerals in FIG. 3 have the same meaning as those in FIG. 2 or FIG. 1. In the case of a large load current Il the arrangement behaves in the same way as that shown in FIG. 2. Substantially the entire input current Ii, amplified by the driver transistor T2, is needed to saturate the output transistor T1, and the efficiency is high. If the load current Il is small the output transistor T1 is saturated unnecessarily far by the surplus of input current Ii. As a result of this, the collector voltage of the output transistor T1 decreases so far below its base voltage that the base-emitter junction of the limiting transistor T3 becomes conductive. This gives rise to a collector current Ic through the limiting transistor T3 from the base of the driver transistor T2 to the collector of the output transistor T1 and via the transistor T1 to the negative power-supply terminal 3. Of the available current Ii only a portion Ii–Ic will now remain available as the base current Ib for the driver transistor T2. The limiting transistor T3 becomes more conductive and the residual base current for T2 decreases as the output transistor T1 is driven further into saturation. This results in a balanced situation in which the base current of the driver transistor and hence the dissipation in the driver transistor is limited. Now the current component Ic need no longer be dissipated in amplified form by the driver transistor but is drained via the limiting transistor and the output transistor. The amount of heat then developed in these two transistors is small. The reduction in dissipation in the driver transistor is substantially larger than the increase in dissipation in the limiting transistor and the output transistor. The efficiency of the output stage for a small load current Il is improved by the addition of the limiting transistor T3.

The invention is not limited to the embodiment shown herein. Within the scope of the invention many variants will be apparent to those skilled in the art. For example, transistors of opposite conductivity types may be employed, or each of said transistors may be replaced by a Darlington transistor. Moreover, the arrangement may form part of a larger arrangement, for example a push-pull output stage. It is also possible to arrange resistors in series with the base, the emitter and the collector of each of the transistors shown, to arrange resistors across the base-emitter junction of the transistors shown, and to arrange a current source between the emitter of the transistor T2 and the negative power-supply terminal 3 without the principle and operation of the invention being affected. The load need not be an electric motor and the output stage may also form part of a system which is normally not driven into saturation. This is the case in, for example, audio amplifiers comprising single ended or push-pull outputs. The situation arising in the event of undesired or inadvertent overdriving of such output stages is in fact the same as in saturated output stages. In that case the arrangement in accordance with the invention protects the output stage against excessive overdriving and limits the dissipation in the driver transistor during overdriving.

I claim:

1. A transistor arrangement comprising an output transistor of a first type and having an emitter, a base and a collector and having its emitter coupled to a reference potential, a driving transistor of said first type having an emitter, a base and a collector and having its emitter coupled to the base of the output transistor and its collector coupled to a power supply potential, and a limiting transistor of said first type having an emitter, a base and a collector and having its emitter coupled to the collector of the output transistor, its collector coupled to the base of the drive transistor for limiting a drive current applied to the base of the driver transistor, and its base coupled to the base of the output transistor.

* * * * *

Disclaimer 4,956,565—Johannes P. M. Bahlmann, Eindhoven, (NL). OUTPUT CIRCUIT WITH DRIVE CURRENT LIMITATION. Patent dated September 11, 1990. Disclaimer filed March 28, 2008, by the assignee, U.S. Philips Corporation.

Hereby enters this disclaimer to all claims of said patent.

(*Official Gazette October 7, 2008*)